(12) United States Patent
Chan et al.

(10) Patent No.: US 10,910,742 B2
(45) Date of Patent: Feb. 2, 2021

(54) TERMINAL CONNECTOR WITH BETTER COMPATIBILITY

(71) Applicant: LEOCO (SUZHOU) PRECISE INDUSTRIAL CO., LTD., Suzhou (CN)

(72) Inventors: Chungcheng Chan, Suzhou (CN); Shanshan Gu, Suzhou (CN)

(73) Assignee: LEOCO (SUZHOU) PRECISE INDUSTRIAL CO., LTD., Suzhou (CN)

(*) Notice: Subject to any disclaimer, the term of this patent is extended or adjusted under 35 U.S.C. 154(b) by 0 days.

(21) Appl. No.: 16/516,712

(22) Filed: Jul. 19, 2019

(65) Prior Publication Data
US 2020/0235502 A1   Jul. 23, 2020

(30) Foreign Application Priority Data
Jan. 17, 2019  (CN) ..................... 2019 2 0080579 U (51) Int. Cl.
*H01R 12/58* (2011.01)
*H01R 13/11* (2006.01)
*H05K 1/18* (2006.01)

(52) U.S. Cl.
CPC ............. *H01R 12/58* (2013.01); *H01R 13/11* (2013.01); *H05K 1/184* (2013.01); *H05K 2201/10333* (2013.01)

(58) Field of Classification Search
CPC ...... H01R 12/58; H01R 13/11; H01R 12/585; H01R 43/16; H05K 1/184; H05K 1/0215
(Continued)

(56) References Cited

U.S. PATENT DOCUMENTS

6,077,128 A * 6/2000 Maag ................... H01R 12/585
                                                               439/751
7,249,981 B2 * 7/2007 Chen .................... H01R 12/585
                                                               439/751
(Continued)

*Primary Examiner* — Jean F Duverne
(74) *Attorney, Agent, or Firm* — Oliff PLC (57) ABSTRACT

A terminal connector with better compatibility; comprising a cylindrical body, and the upper end of the cylindrical body is set with a coronal structure; an obconical structure is set on the cylindrical body, and the obconical structure is annularly protruded from the outer peripheral surface of the cylindrical body, the obconical structure is spaced apart from the coronal structure; the obconical structure comprises an annular upper end surface and an annular conical surface; through the design of the obconical structure, the diameter of the cylindrical body can be gradually increased from the bottom to the top of the obconical structure; wherein, a plurality of damping patterns is set on the annular conical surface of the obconical structure. The utility model can be compatible with the positioning holes of different apertures during the assembly with PCB and also has greater tolerance for the tolerance of the flatness of the PCB surface, and it has the advantages of saving production cost and high capacity utilization. In addition, the design of the neck improves the reliability of positioning on the carrier tape and the design of slope on the lower end surface of the coronal structure makes the product easily detach downwardly from the carrier tape, thereby improving the fluency of production.

5 Claims, 6 Drawing Sheets

(58) Field of Classification Search
USPC .......................................................... 439/889
See application file for complete search history.

(56) References Cited

U.S. PATENT DOCUMENTS

| | | | |
|---|---|---|---|
| 8,142,236 B2* | 3/2012 | Fedder ................. | H01R 12/585 |
| | | | 439/751 |
| 8,992,235 B2* | 3/2015 | Kataoka ............... | H01R 12/585 |
| | | | 439/751 |
| 9,276,338 B1* | 3/2016 | Dariavach ............ | H01R 12/585 |
| 10,236,603 B2* | 3/2019 | Goto ..................... | H01R 43/16 |
| 2013/0255993 A1* | 10/2013 | Hsieh ................... | H05K 1/0215 |
| | | | 174/135 |

* cited by examiner

TERMINAL CONNECTOR WITH BETTER COMPATIBILITY

TECHNICAL FIELD

The present utility model relates to a terminal connector fixed on a PCB, and more particularly to a terminal connector with better compatibility and adapting to the assembly requirements of different apertures. The terminal connector in the utility model is a female end, i.e. connected end.

BACKGROUND OF INVENTION

Figure 1:
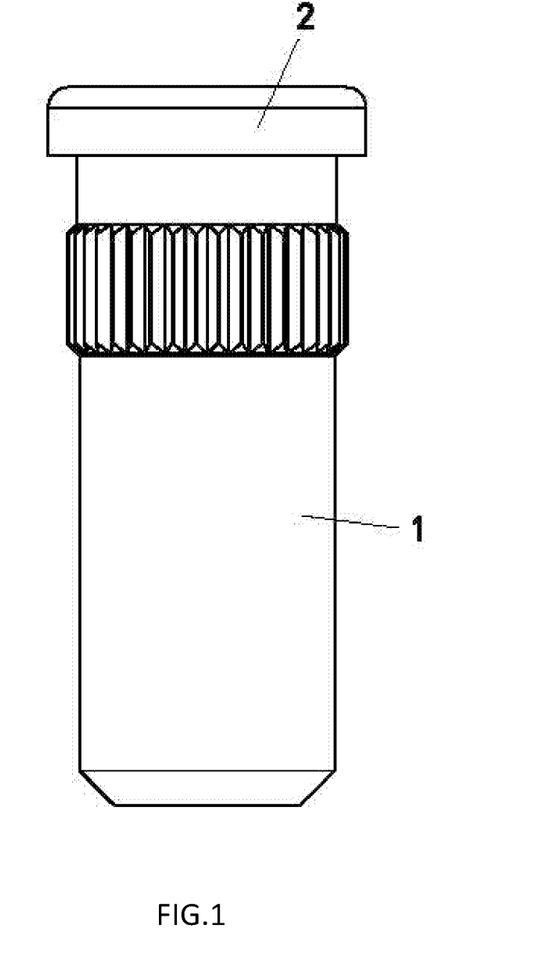
FIG. 1 is a schematic view of prior art.
Figure 2:
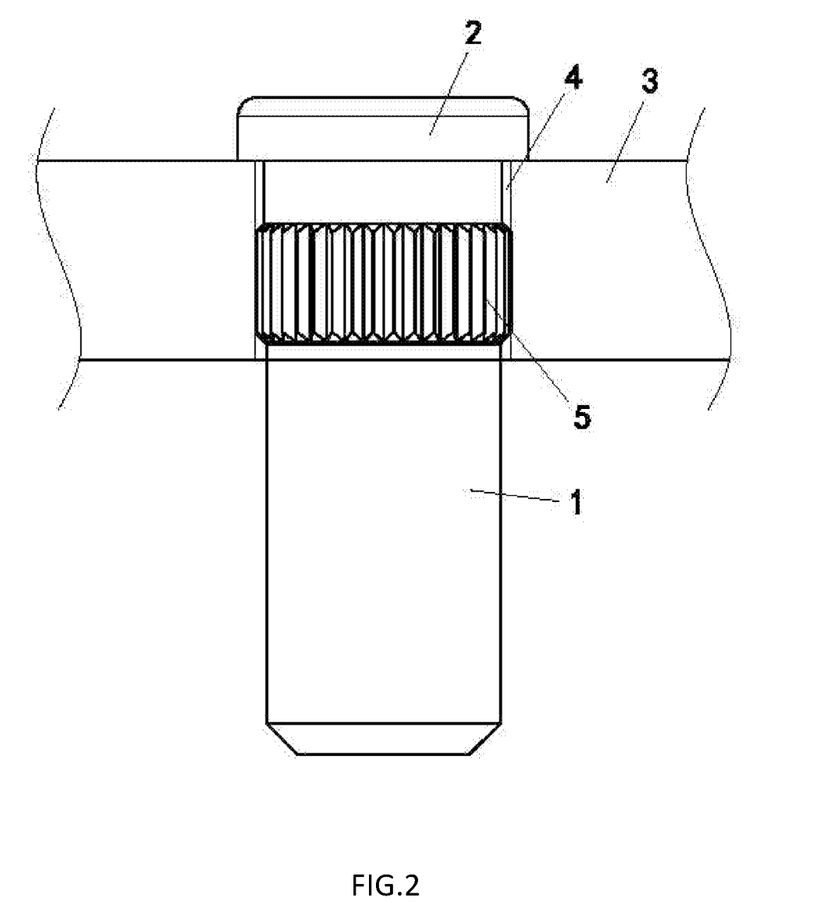
FIG. 2 is a reference view of the use state of the prior art.

The terminal connector is a common electrical connection component in a PCB, and it achieves the electrical connection by inserting the PIN pin. As shown in FIG. 1 and FIG. 2, it is a schematic structural diagram of an existing terminal connector and a reference view of its use state. The existing terminal connector includes a cylindrical body 1 and a PIN pin is inserted into the cylindrical body 1 from above to achieve electrical connection. The cylindrical body 1 has a coronal structure 2 at the upper end and the angle between the lower end surface of the coronal structure 2 and the outer side of the cylindrical body 1 is a right angle.

During the production of carrier tape for SMT attachment, the cylindrical body 1 of the terminal connector is inserted into the mounting hole on the carrier tape, and the coronal structure 2 of the terminal connector is attached and snapped to the upper surface of the carrier tape. After the PCB assembly is completed, the cylindrical body 1 of the terminal connector is inserted into the positioning hole 4 on the PCB 3 to achieve the assembly. And the cylindrical body 1 is provided with a ring of annular damping surface 5 at the upper section to achieve the stability of PCB combination.

The above prior art has the following deficiencies:

I. Since the diameter of the cylindrical body 1 of the terminal connector is fixed, the positioning hole 4 of only one aperture could be adapted for the assembly of PCB without any compatibility. Manufacturers must design and manufacture a lot of products of different diameters to meet the assembly needs of different apertures, with high cost and low capacity utilization.

II. Since the angle between the lower end surface of the coronal structure 2 and the outer side of the cylindrical body 1 is a right angle, the product could not be easily detached downward from the carrier tape during the attachment of SMT due to the limit of coronal structure 2, which adversely affects the fluency of production.

Therefore, it's a problem for the utility model to solve the deficiencies of the above-mentioned prior art.

DISCLOSURE OF THE INVENTION

The purpose of the utility model is to provide a terminal connector with better compatibility.

In order to achieve the above purpose, the utility model applies the technical solution:

A terminal connector with better compatibility, comprising a cylindrical body, and the upper end of the cylindrical body is set with a coronal structure; wherein:
an obconical structure is set on the cylindrical body, and the obconical structure is annularly protruded from the outer peripheral surface of the cylindrical body, the obconical structure is spaced apart from the coronal structure to form a neck between the coronal structure and the obconical structure;
the obconical structure comprises an annular upper end surface and an annular conical surface; the lower end of the annular conical surface is connected to the outer peripheral surface of the cylindrical body and the upper end of the annular conical surface is connected to the outer edge of the annular upper end surface; through the design of the obconical structure, the diameter of the cylindrical body can be gradually increased from the bottom to the top of the obconical structure, thereby adapting to the aperture of positioning holes of different PCBs;
wherein, a plurality of damping patterns is set on the annular conical surface of the obconical structure to enhance its engagement force with the positioning hole of PCB.

The above described technical solution is explained as follows:

1. In above described technical solution, the neck is used to connect the mounting hole on the carrier tape, and the height of the neck corresponds to the thickness of the carrier tape to enhance the reliability of combination of terminal connector with the carrier tape.

2. In above described technical solution, the damping patterns increase the damping to enhance the reliability of assembly of terminal connector with the PCB and weaken the strength of obconical structure to some extent, which is conducive to generate a certain deformation during the assembly and combination with PCB to avoid the hard assembly.

3. In above described technical solution, the terminal connector comprises a spring pawl, and the spring pawl is inserted downwardly from above the cylindrical body into and positioned on an insertion hole of the cylindrical body, and the spring pawl has a plurality of elastic arms extending downwardly and spaced apart from each other in the lateral direction. The insertion of a PIN pin into the terminal connector achieves the contact with the elastic arms of the spring pawl to form a complete circuit connection.

4. In above described technical solution, the elastic arms of the spring pawl are provided with R angle at the bottom end to reduce the friction on the surface of PIN pin when the PIN pin is inserted and removed.

5. In above described technical solution, the lower end surface of the coronal structure is designed as a slope and the upper end of the slope is connected to the outer edge of the coronal structure and the lower end of the slope is connected to the outer peripheral surface of the cylindrical body. During the SMT attachment, the slope acts as a guide to facilitate the detachment of terminal connector from the mounting hole of the carrier tape.

6. In above described technical solution, the damping patterns may be in any form or combination of the following: longitudinal pattern, lateral pattern, cross pattern and scattered pattern. However, it is not limited to the above several forms, and may be other damping patterns roughening the annular conical surface.

The working principle and advantages of the utility model are as follows: A terminal connector with better compatibility of the utility model; comprising a cylindrical body, and the upper end of the cylindrical body is set with a coronal structure; an obconical structure is set on the cylindrical body, and the obconical structure is annularly protruded from the outer peripheral surface of the cylindrical body, the obconical structure is spaced apart from the coronal structure to form a neck between the coronal structure and the obconical structure; the obconical structure comprises an annular upper end surface and an annular conical surface; through the design of the obconical structure, the diameter of the cylindrical body can be gradually increased from the bottom to the top of the obconical structure; wherein, a plurality of damping patterns is set on the annular conical surface of the obconical structure.

Compared with the prior art, the utility model can be compatible with the positioning holes of different apertures during the assembly with PCB and also has greater tolerance for the tolerance of the flatness of the PCB surface. It has the advantages of saving production cost and high capacity utilization.

In addition, the design of the neck improves the reliability of positioning on the carrier tape and the design of slope on the lower end surface of the coronal structure makes the product easily detach downwardly from the carrier tape, thereby improving the fluency of production.

In the above described drawings: 1. cylindrical body; 2. coronal structure; 3. PCB; 4. positioning hole; 5. annular damping surface; 6. cylindrical body; 7. coronal structure; 8. obconical structure; 9. neck; 10. carrier tape; 11. annular upper end surface; 12. annular conical surface; 13. PCB; 14. positioning hole; 15. damping pattern; 16. spring pawl; 17. insertion hole; 18. elastic arm; 19. PIN pin; 20. R angle; 21. slope.

Specific Embodiment

With reference to the accompanying drawings and embodiment, the present utility model will be described in detail.

Figure 7A:
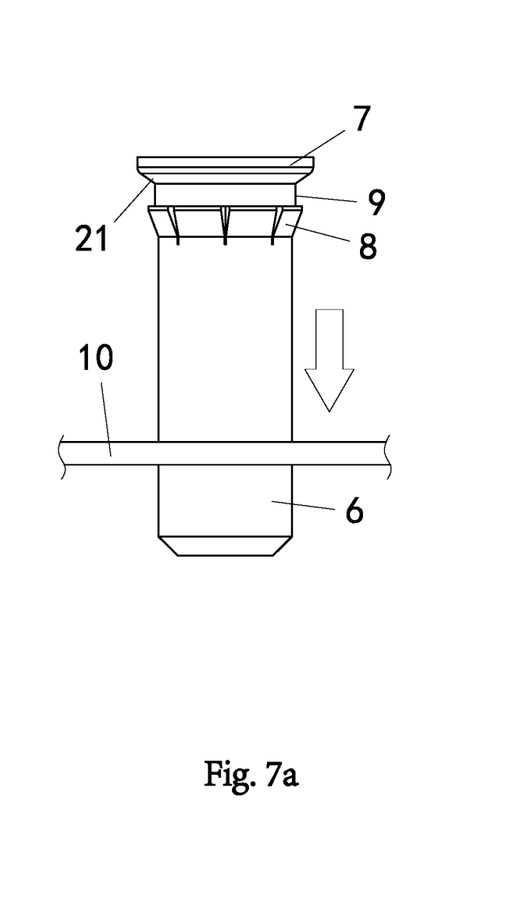
FIG. 7a is a schematic view of the embodiment of this utility model ready to be combined with the carrier tape.
Figure 7B:
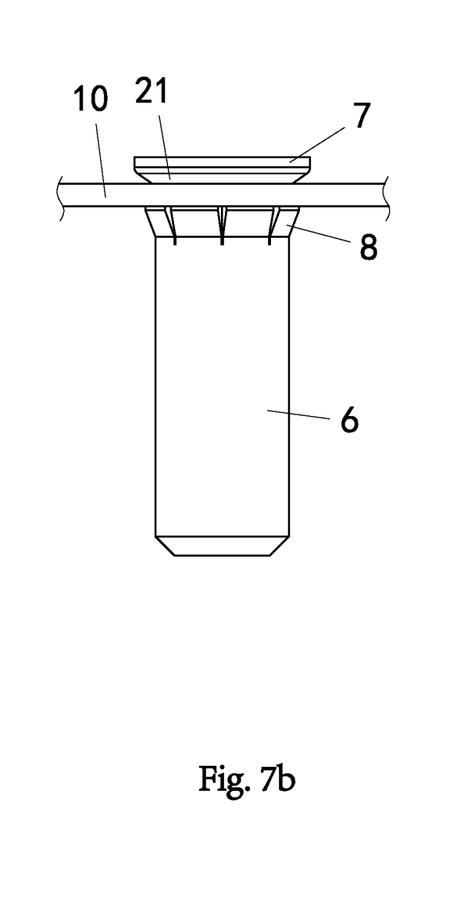
FIG. 7b is a schematic view of the embodiment of this utility model combined with the carrier tape.

Embodiment: As shown in FIG. 3-6, a terminal connector with better compatibility; comprising a cylindrical body 6, and the upper end of the cylindrical body 6 is set with a coronal structure 7;

An obconical structure 8 is set on the cylindrical body 6, and the obconical structure 8 is annularly protruded from the outer peripheral surface of the cylindrical body 6 to form a clip; the obconical structure 8 is spaced apart from the coronal structure 7 to form a neck 9 between the coronal structure 7 and the obconical structure 8; and the neck 9 is used to connect the mounting hole on the carrier tape 10, and the height of the neck 9 corresponds to the thickness of the carrier tape 10 to enhance the reliability of combination of terminal connector with the carrier tape 10; as shown in FIGS. 7a and 7b, the terminal connector moves downward to be assembled with the carrier tape 10 and to be positioned on the carrier tape 10 through the neck 9.

Figure 3:
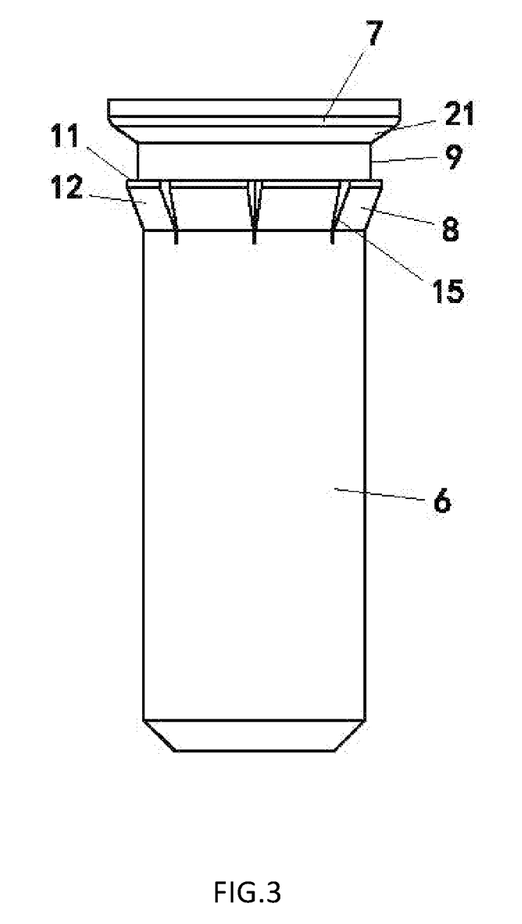
FIG. 3 is a schematic view of cylindrical body of embodiment of this utility model.

The obconical structure 8 comprises an annular upper end surface 11 and an annular conical surface 12; as shown in FIG. 3, the annular conical surface 12 is wide at the top and narrow at the bottom and its lower end is connected to the outer peripheral surface of the cylindrical body 6 and its upper end is connected to the outer edge of the annular upper end surface 11; through the design of the obconical structure 8, the diameter of the cylindrical body 6 can be gradually increased from the bottom to the top of the obconical structure, therefore the assembly depth can be changed to adapt to the positioning hole 14 of different apertures during its assembly with PCBs;

Wherein, the angle between the annular conical surface 12 of the obconical structure 8 and the outer peripheral surface of the cylindrical body 6 is less than 90 degrees and a plurality of damping patterns 15 is set on the annular conical surface 12 of the obconical structure. The damping is increased to enhance the reliability of assembly with the PCB 13 and weaken the strength of the obconical structure 8 to some extent, which is conducive to generate a certain deformation during the assembly and combination with PCB 13 to avoid the hard assembly. After the assembly of the terminal connector with the PCB 13 is completed, the wave-soldering can be made to fix it with the PCB 13.

Figure 4:
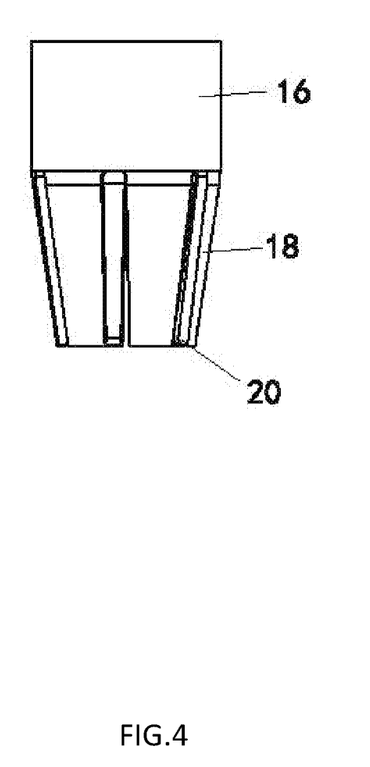
FIG. 4 is a schematic view of spring pawl of embodiment of this utility model.
Figure 5:
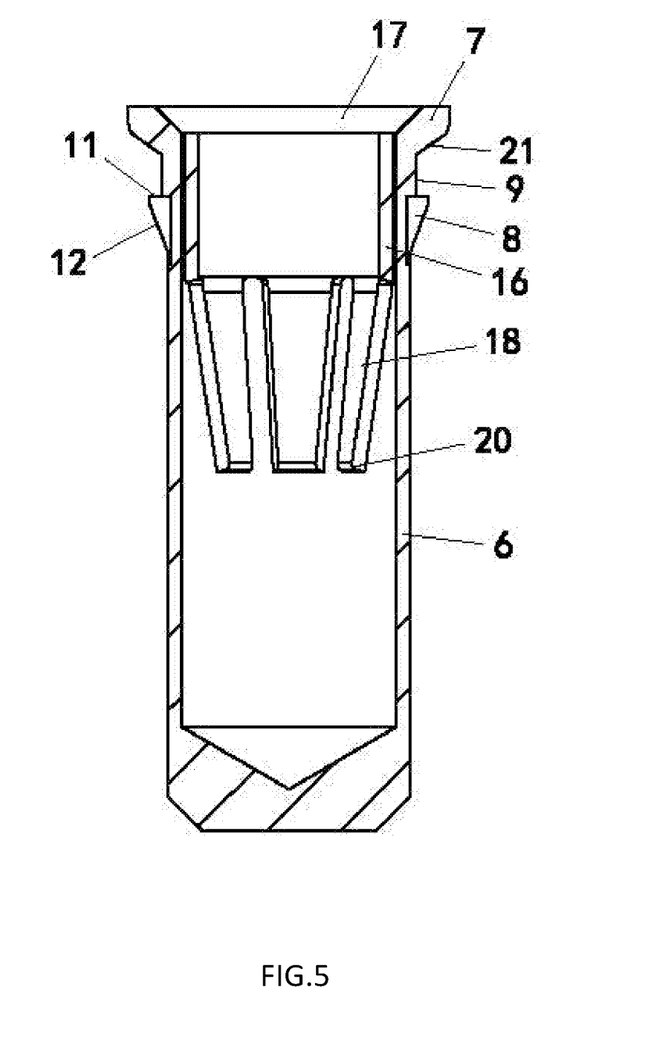
FIG. 5 is a sectional structure view of embodiment of this utility model.
Figure 6:
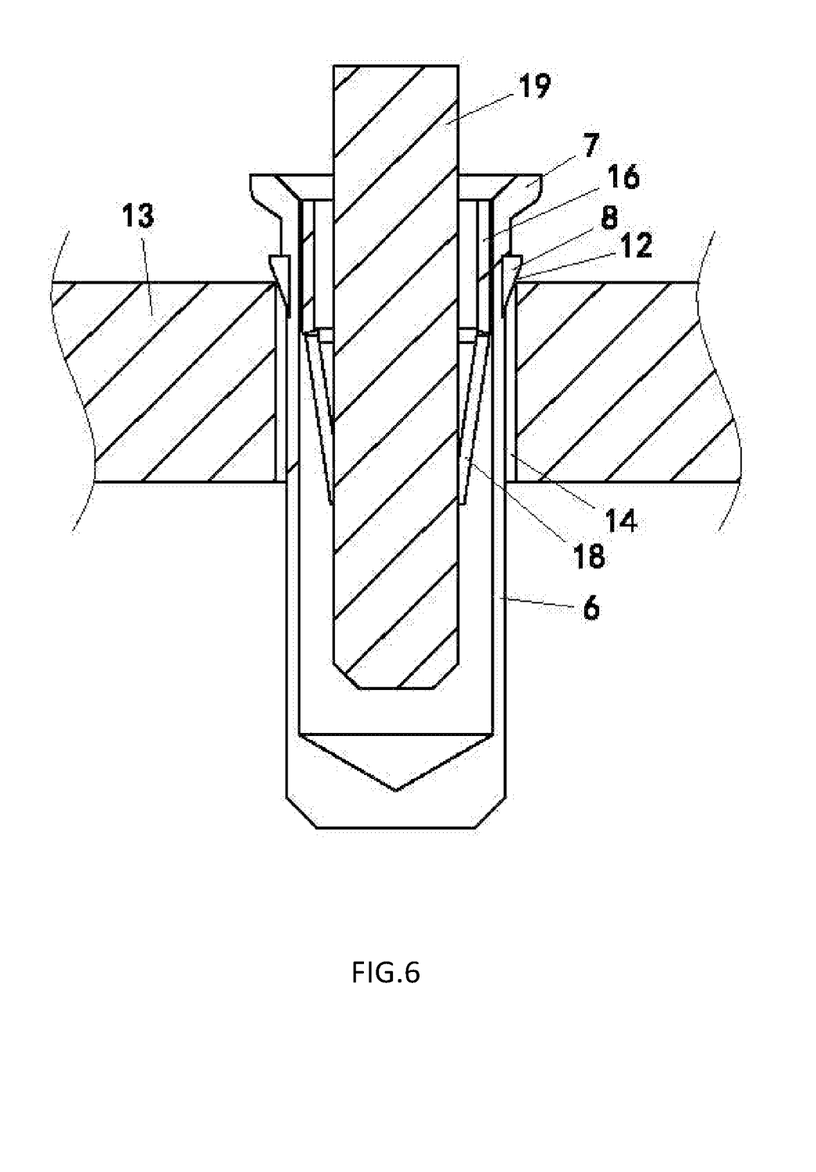
FIG. 6 is a reference view of the use state of the embodiment of this utility model.

Wherein, the terminal connector comprises a spring pawl 16, and the spring pawl 16 is inserted downwardly from above the cylindrical body 6 into and positioned on an insertion hole 17 of the cylindrical body 6 and the spring pawl 16 has a plurality of elastic arms 18 extending downwardly and spaced apart from each other in the lateral direction. The insertion of a PIN pin 19 into the terminal connector achieves the contact with the elastic arms 18 of the spring pawl 16 to form a complete circuit connection. The elastic arms 18 of the spring pawl 16 are provided with R angle 20 at the bottom end to reduce the friction on the surface of PIN pin 19 when the PIN pin 19 is inserted and removed.

Figure 7C:
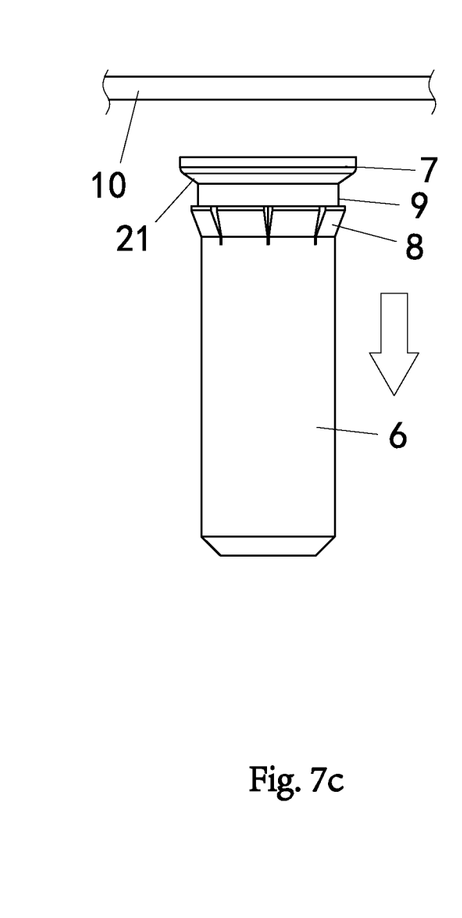
FIG. 7c is a schematic view of the embodiment of this utility model detached from the carrier tape.

Wherein, the lower end surface of the coronal structure 7 is designed as a slope 21 and the upper end of the slope 21 is connected to the outer edge of the coronal structure 7 and the lower end of the slope is connected to the outer peripheral surface of the cylindrical body 6. As shown in FIG. 7b, 7c, during the SMT attachment, the slope 21 acts as a guide to facilitate the detachment of terminal connector from the mounting hole of the carrier tape 10.

Wherein, the damping patterns 15 may be in any form or combination of the following: longitudinal pattern, lateral pattern, cross pattern and scattered pattern. However, it is not limited to the above several forms, and may be other damping patterns roughening the annular conical surface 12 and the figure in this embodiment is the longitudinal pattern.

Compared with the prior art, the utility model can be compatible with the positioning holes of different apertures during the assembly with PCB and also has greater tolerance for the tolerance of the flatness of the PCB surface. It has the advantages of saving production cost and high capacity utilization.

In addition, the design of the neck improves the reliability of positioning on the carrier tape and the design of slope on the lower end surface of the coronal structure makes the product easily detach downwardly from the carrier tape, thereby improving the fluency of production.

It should be noted that the above described embodiments are only for illustration of technical concept and characteristics of present utility model with purpose of making those skilled in the art understand the present utility model, and thus these embodiments shall not limit the protection range of present utility model. The equivalent changes or modifications according to spiritual essence of present utility model shall fall in the protection scope of present utility model.

The invention claimed is:

1. A terminal connector with better compatibility, comprising:
   a cylindrical body, an upper end of the cylindrical body being set with a coronal structure; wherein:
   an obconical structure is set on the cylindrical body, the obconical structure is annularly protruded from an outer peripheral surface of the cylindrical body, and the obconical structure is spaced apart from the coronal structure to form a neck between the coronal structure and the obconical structure;
   the obconical structure comprises an annular upper end surface and an annular conical surface, a lower end of the annular conical surface is connected to the outer peripheral surface of the cylindrical body, an upper end of the annular conical surface is connected to an outer edge of the annular upper end surface, and a diameter of the cylindrical body is configured to be gradually increased from the bottom to the top of the obconical structure, thereby adapting to the aperture of positioning holes of different printed circuit boards (PCBs); and
   a plurality of damping patterns is set on the annular conical surface of the obconical structure to enhance its engagement force with a positioning hole of a PCB.

2. The terminal connector according to claim 1, wherein:
   the terminal connector comprises a spring pawl, and the spring pawl is inserted downwardly from above the cylindrical body into and positioned in an insertion hole of the cylindrical body; and
   the spring pawl has a plurality of elastic arms extending downwardly and spaced apart from each other in the lateral direction.

3. The terminal connector according to claim 2, wherein:
   the elastic arms of the spring pawl are provided with R angle at the bottom end.

4. The terminal connector according to claim 1, wherein:
   a lower end surface of the coronal structure is designed as a slope, an upper end of the slope is connected to an outer edge of the coronal structure, and a lower end of the slope is connected to the outer peripheral surface of the cylindrical body.

5. The terminal connector according to claim 1, wherein:
   the damping patterns comprise any form of patterns including a longitudinal pattern, a lateral pattern, a cross pattern and a scattered pattern.

* * * * *